(12) United States Patent
Deak et al.

(10) Patent No.: US 10,107,871 B2
(45) Date of Patent: Oct. 23, 2018

(54) MONOLITHIC THREE-AXIS MAGNETIC FIELD SENSOR AND ITS MANUFACTURING METHOD

(71) Applicant: MultiDimension Technology Co., Ltd., Zhangjiagang (CN)

(72) Inventors: James Geza Deak, Zhangjiagang (CN); Dan Li, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 70 days.

(21) Appl. No.: 15/300,068

(22) PCT Filed: Mar. 26, 2015

(86) PCT No.: PCT/CN2015/075146
§ 371 (c)(1),
(2) Date: Sep. 28, 2016

(87) PCT Pub. No.: WO2015/144073
PCT Pub. Date: Oct. 1, 2015

(65) Prior Publication Data
US 2017/0176545 A1    Jun. 22, 2017

(30) Foreign Application Priority Data
Mar. 28, 2014    (CN) .......................... 2014 1 0123285

(51) Int. Cl.
*G01R 33/09* (2006.01)
*G01R 33/00* (2006.01)
(Continued)

(52) U.S. Cl.
CPC ...... *G01R 33/0011* (2013.01); *G01R 33/0052* (2013.01); *G01R 33/0206* (2013.01);
(Continued)

(58) Field of Classification Search
CPC ....................................................... G01R 33/09
See application file for complete search history.

(56) References Cited

U.S. PATENT DOCUMENTS

2006/0176142 A1* 8/2006 Naito ................. G01R 33/0206
                                                                338/32 R
2008/0169807 A1* 7/2008 Naito ..................... B82Y 25/00
                                                                324/252
(Continued)

FOREIGN PATENT DOCUMENTS

CN        1979210      6/2007
CN        102292773    12/2011
(Continued)

OTHER PUBLICATIONS

"International Application PCT/CN2015/075146, International Search Report and Written Opinion dated Jul. 1, 2015", (dated Jul. 1, 2015), 11 pgs.
(Continued)

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

A monolithic three-axis magnetic field sensor comprises an X-axis sensor, a Y-axis sensor and a Z-axis sensor integrated into the same substrate. The X-axis sensor and the Y-axis are both referenced bridge structures. The magnetoresistive sensing elements of the reference arm are beneath the corresponding magnetic flux guides, and the magnetoresistive sensing elements are in the gaps between the corresponding magnetic flux guides. The magnetoresistive elements of these two sensors are aligned perpendicular to each other, and the magnetization directions of the pinned layer of these magnetoresistive elements are perpendicular to each other as well. The Z-axis sensor is a push-pull bridge (Continued)

structure. The push arms and pull arms of the magnetoresistive sensors are respectively aligned above or beneath the edges of the magnetic flux guides. The manufacturing method for this monolithic three-axis magnetic field sensor is also disclosed.

12 Claims, 17 Drawing Sheets

(51) Int. Cl.
    *G01R 33/02*     (2006.01)
    *H01L 43/08*     (2006.01)
    *H01L 43/12*     (2006.01)

(52) U.S. Cl.
    CPC .............. *G01R 33/09* (2013.01); *H01L 43/08* (2013.01); *H01L 43/12* (2013.01)

(56) References Cited

U.S. PATENT DOCUMENTS

2009/0315554 A1   12/2009   Witcraft et al.
2013/0221949 A1*   8/2013   Liu ................... G01R 33/0011
                                                   324/202

FOREIGN PATENT DOCUMENTS

| | | |
|---|---|---|
| CN | 102426344 A | 4/2012 |
| CN | 202548308 U | 11/2012 |
| CN | 103267520 | 8/2013 |
| CN | 103267955 | 8/2013 |
| CN | 103412269 | 11/2013 |
| CN | 203480009 | 3/2014 |
| CN | 103913709 | 7/2014 |
| CN | 203811786 | 9/2014 |
| EP | 2267470 | 12/2010 |
| WO | WO-2013029510 | 3/2013 |
| WO | WO-2015144073 | 10/2015 |

OTHER PUBLICATIONS

"Chinese Application No. 201410123285.8, First Office Action dated Feb. 2, 2016", (dated Feb. 2, 2016), 20 pgs.
"Chinese Application No. 201410123285.8, Second Office Action dated Sep. 5, 2016", (dated Sep. 5, 2016), 20 pgs.
"European Application No. 15768352.5, Extended European Search Report dated Nov. 17, 2006", (dated Nov. 17, 2006), 14 pgs.

* cited by examiner

MONOLITHIC THREE-AXIS MAGNETIC FIELD SENSOR AND ITS MANUFACTURING METHOD

PRIORITY CLAIM TO RELATED APPLICATIONS

This application is a U.S. national stage application filed under 35 U.S.C. § 371 from International Application Serial No. PCT/CN2015/075146, which was filed 26 Mar. 2015, and published as WO2015/144073 on 1 Oct. 2015, and which claims priority to Chinese Application No. 201410123285.8, filed 28 Mar. 2014, which applications and publication are incorporated by reference as if reproduced herein and made a part hereof in their entirety, and the benefit of priority of each of which is claimed herein.

TECHNICAL FIELD

The present invention relates to the field of magnetic field sensors, and in particular to a monolithic three-axis magnetic field sensor and its manufacturing method.

BACKGROUND ART

With development of magnetic field sensor technologies, magnetic field sensors have developed from early single-axis magnetic field sensors to later double-axis magnetic field sensors and then to current three-axis magnetic field sensors, such that they can detect magnetic field signals in three directions of X, Y and Z axes in the space comprehensively. For magnetic field sensors such as AMR, Giant Magnetoresistive (GMR) and Tunneling Magnetoresistive (TMR), a magnetic field sensing direction is in a film plane, and measurement on X-axis and Y-axis magnetic field components in the plane may be implemented by making two sensors orthogonal, thereby implementing an XY two-axis magnetic field test system. However, for a Z-axis magnetic field component, a solution is erecting a discrete single-axis plane magnetic field sensor on a two-axis plane sensor, for example, a three-axis magnetic field sensor disclosed in the patent with Application No. 201110251902.9 and entitled "Three-Axis Magnetic Field Sensor". However, this method has the following defects:

1) The X, Y two-axis magnetic field sensor and the Z single-axis magnetic field sensor are discrete elements before mounting, so that integrated manufacture of the three-axis magnetic field sensor cannot be implemented, thereby increasing the complexity of the manufacturing process.

2) Compared with an integrated manufacturing system, position precisions of elements in a three-axis magnetic field sensor system manufactured by assembling are reduced, thus affecting the measurement precision of the sensor.

3) A sensing axis of the Z single-axis magnetic field sensor is perpendicular to the X, Y two-axis magnetic field sensor, and therefore, the dimension of the three-axis magnetic field sensor in the Z direction is increased, thereby increasing the device size and the difficulty in packaging.

Another solution is using a slope to set a magnetic field sensor unit to detect a magnetic signal in the Z direction, as disclosed in the patent CN202548308U entitled "Three-Axis Magnetic Field Sensor". However, an angle of forming the slope in the sensor in this structure is hard to control, and shadowing effects are likely to be caused in the process of depositing a magnetoresistive film on the slope, thereby reducing the performance of a magnetic field sensor element. Moreover, an algorithm is needed to calculate a magnetic signal in the Z-axis direction.

Another solution is a solution disclosed in the patent application 201310202801.1 entitled "A Three-Axis Digital Compass", which converts a Z-axis magnetic field component perpendicular to a plane into a magnetic field component in an XY plane by using a distortion function of a flux concentrator on the magnetic field, thereby implementing measurement on a magnetic signal in a Z-axis direction. However, the magnetic field sensor in this structure needs an Application-Specific Integrated Circuit (ASIC) chip or computation using an algorithm to obtain magnetic signals in three directions of the X, Y and Z axes.

Currently, a three-axis magnetic field sensor is manufactured mainly by methods such as etching a substrate layer of a substrate to form a slope, depositing a magnetoresistive material film on the slope and double deposition, for example, a manufacturing process of a sensor disclosed in the patent CN202548308U entitled "Three-Axis Magnetic Field Sensor" substantially comprises etching a substrate layer of a wafer to form two slopes, double-depositing a magnetoresistive material film on the two slopes respectively, and conducting double annealing to manufacture sensor units in an XZ direction and a YZ direction. The European Patent Application EP 2267470 B1 also discloses a method for manufacturing a three-axis sensor, in which a substrate is etched to form a slope, and a sensor unit for measuring a magnetic field component in a Z-axis direction is manufactured on the slope. Grades of the etched slopes in the two patent applications are hard to control, and there is difficulty in depositing the magnetoresistive material film on the slope, which are not conducive to actual implementation.

SUMMARY OF THE INVENTION

To solve the above problems, the present invention provides a monolithic three-axis magnetic field sensor and its manufacturing method. The monolithic three-axis magnetic field sensor can directly output magnetic signals in three directions of X, Y and Z without the need to conduct computation with an algorithm. Moreover, the manufacture thereof does not need grooving to form a slope, and the three-axis magnetic field sensor can be obtained directly by double deposition, in which an X-axis sensor and a Y-axis sensor are perpendicular to each other, and magnetization directions of pinned layers of magnetoresistive sensing element comprised therein are also perpendicular to each other.

A monolithic three-axis magnetic field sensor provided in the present invention comprises:

a substrate in an XY plane, the substrate having an X-axis sensor, a Y-axis sensor and a Z-axis sensor integrated thereon for detecting magnetic field components in an X-axis direction, a Y-axis direction and a Z-axis direction, respectively;

the X-axis sensor and the Y-axis sensor each comprising a reference bridge and at least two magnetic flux guides, a reference arm and a sensing arm of the reference bridge each comprising one or more identical magnetoresistive sensing elements electrically connected to one another, the magnetoresistive sensing elements on the reference arm being placed above or beneath the magnetic flux guides, and being arranged along length directions of the magnetic flux guides to form reference element series, the magnetoresistive sensing elements on the sensing arm being placed at gaps between the adjacent two of the magnetic flux guides, and being arranged along the length directions of the magnetic flux guides to form sensing element series; the reference element series and the sensing element series being mutually staggered, each one of the reference element series being adjacent to at least one of the sensing element series, and each one of the sensing element series being adjacent to at least one of the reference element series;

arrangement directions of elements in the Y-axis sensor being mutually perpendicular to those of corresponding elements in the X-axis sensor;

all gain coefficients of magnetic fields at gaps between the respective adjacent two of the magnetic flux guides in the X-axis sensor and the Y-axis sensor being $1<A_{sns}<100$, and all attenuation coefficients of magnetic fields above or beneath the magnetic flux guides of the X-axis sensor and the Y-axis sensor being $0<A_{ref}<1$;

the Z-axis sensor comprising a push-pull bridge and at least one magnetic flux guide, a push arm and a pull arm of the push-pull bridge being staggered and each comprising the one or more identical magnetoresistive sensing elements electrically connected to one another, the magnetoresistive sensing elements on the push arm and the pull arm being arranged along a length direction of the magnetic flux guide in the Z-axis sensor, and respectively placed at two sides of the bottom or the top of the magnetic flux guide in the Z-axis sensor;

pinned layers of the magnetoresistive sensing elements of the X-axis sensor and the Y-axis sensor being made of different materials, and magnetization directions of the pinned layers being perpendicular to each other; magnetization directions of pinned layers of the Z-axis sensor and the X-axis sensor being the same; when there is no external magnetic field, magnetization directions of magnetic free layers of all the magnetoresistive sensing elements being perpendicular to the magnetization directions of the pinned layers;

wherein, the X-axis, the Y-axis and the Z-axis are pairwise orthogonal to one another.

Preferably, the magnetoresistive sensing element is a GMR spin valve element or a TMR sensing element.

Preferably, the magnetic flux guide is an array of rectangular strips, the length thereof in a direction perpendicular to the magnetization direction of the pinned layer of the magnetoresistive sensing element being greater than the length thereof along the magnetization direction of the pinned layer of the magnetoresistive sensing element, and is made of soft ferromagnetic alloy.

Preferably, the numbers of the magnetoresistive sensing elements on the respective sensing arms and reference arms of the X-axis sensor and the Y-axis sensor are the same; and the numbers of the magnetoresistive sensing elements on the push arm and the pull arm of the push-pull bridge of the Z-axis sensor are the same.

Preferably, the length of the magnetoresistive sensing element in a direction perpendicular to the magnetization direction of the pinned layer is greater than the length thereof along the magnetization direction of the pinned layer.

Preferably, a gap S between the adjacent two of the magnetic flux guides of the Z-axis sensor is not less than the minimum one of three-dimensional sizes of the magnetic flux guide of the Z-axis sensor.

Preferably, when there is no external magnetic field, the magnetoresistive sensing elements achieve magnetization direction of the magnetic free layer perpendicular to that of the pinned layer by permanent magnet bias, double-exchange interaction, shape anisotropy or any combination thereof.

Preferably, the reference bridge and the push-pull bridge are both of a half-bridge, full-bridge or quasi-bridge structure.

Preferably, the substrate is integrated with an ASIC chip thereon, or the substrate is electrically connected to a separate ASIC chip.

Preferably, the monolithic three-axis magnetic field sensor further comprises at least 3 bonding pads, or the X-axis sensor, the Y-axis sensor and the Z-axis sensor each have at least 3 through silicon vias.

The present invention further provides a method for manufacturing a monolithic three-axis linear magnetic field sensor, the method comprising:

(1) depositing a first magnetoresistive material film stack on a semiconductor wafer, and setting a magnetization direction of a pinned layer of the first magnetoresistive material film stack;

or;

depositing a first magnetoresistive material film stack on a semiconductor wafer, and setting a magnetization direction of a pinned layer of the first magnetoresistive material film stack by annealing;

the first magnetoresistive material film stack using an antiferromagnetic layer having a blocking temperature of TB1 as its pinned layer, and the first magnetoresistive material film stack being used to construct an X-axis sensor and a Z-axis sensor;

(2) selecting some regions on the semiconductor wafer, and removing the first magnetoresistive material film stack in the selected regions;

(3) depositing a second magnetoresistive material film stack on the semiconductor wafer, the second magnetoresistive material film stack using an antiferromagnetic layer having a blocking temperature of TB2 as its pinned layer, and the second magnetoresistive material film stack being used to construct a Y-axis sensor, wherein TB1>TB2; conducting first high-temperature annealing in an external magnetic field having a magnetic field direction being parallel to the magnetization directions of the pinned layers of the X-axis sensor and the Z-axis sensor at a temperature higher than TB1, reducing the temperature to a value between TB1 and TB2, rotating the external magnetic field so that the direction thereof is identical to the magnetization direction of the pinned layer of the Y-axis sensor, reducing the temperature to room temperature, and reducing the external magnetic field to a zero magnetic field;

(4) masking the first magnetoresistive material film stack and the second magnetoresistive material film stack, and removing parts of the second magnetoresistive material film stack overlapping with the first magnetoresistive material film stack;

(5) constructing a bottom electrode, and constructing magnetoresistive sensing elements in the X-axis sensor, the Y-axis sensor and the Z-axis sensor in the same structure forming step, wherein the bottom electrode is constructed before or after the magnetoresistive sensing elements of the X-axis sensor, the Y-axis sensor and the Z-axis sensor are constructed;

(6) depositing an insulation layer I on the magnetoresistive sensing element, and producing a contact hole at a top end of the magnetoresistive sensing element through the insulation layer I; the contact hole being implemented by a self-alignment technology comprising a lift off process, or implemented by opening a hole downward at a top end of the magnetoresistive sensing element through the insulation layer I by use of a photolithographic or etching process;

(7) depositing a top conducting layer electrically connected to a top layer of the magnetoresistive sensing element, forming a top electrode using a patterning process, and wiring between elements;

(8) depositing an insulation layer II;

or;

depositing an insulation layer III, then depositing a conducting layer on the deposited insulation layer III to construct an electromagnetic coil layer, and depositing an insulation layer IV at the top of the electromagnetic coil layer;

(9) synchronously forming a plurality of magnetic flux guides above the insulation layer II or the insulation layer IV by using the same soft ferromagnetic material;

(10) depositing a passivation layer above all the magnetic flux guides, etching the passivation layer, and opening vias at positions corresponding to the top conductor and the bottom electrode;

or;

depositing a passivation layer above all the magnetic flux guides, etching the passivation layer, opening vias at positions corresponding to the top electrode and the bottom electrode, forming a bonding pad connected to a sensor chip, and sputtering or electroplating a conducting metal at a top end of the bonding pad.

Preferably, the semiconductor wafer is a silicon wafer doped with an integrated circuit, a silicon wafer subjected to chemico-mechanical polishing, or a blank silicon wafer comprising a passivated smooth surface.

BRIEF DESCRIPTION OF DRAWINGS

To describe the technical solutions in the technologies in examples of the present invention more clearly, accompanying drawings that need to be used in the technologies in the examples are introduced briefly. Apparently, the accompanying drawings described in the following are only some examples of the present invention, and those of ordinary skill in the art can further obtain other accompanying drawings according to the accompanying drawings without any creative work.

DETAILED DESCRIPTION OF THE INVENTION

The present invention will be described in detail below with reference to the accompanying drawings and in combination with examples.

Example 1

Figure 1:
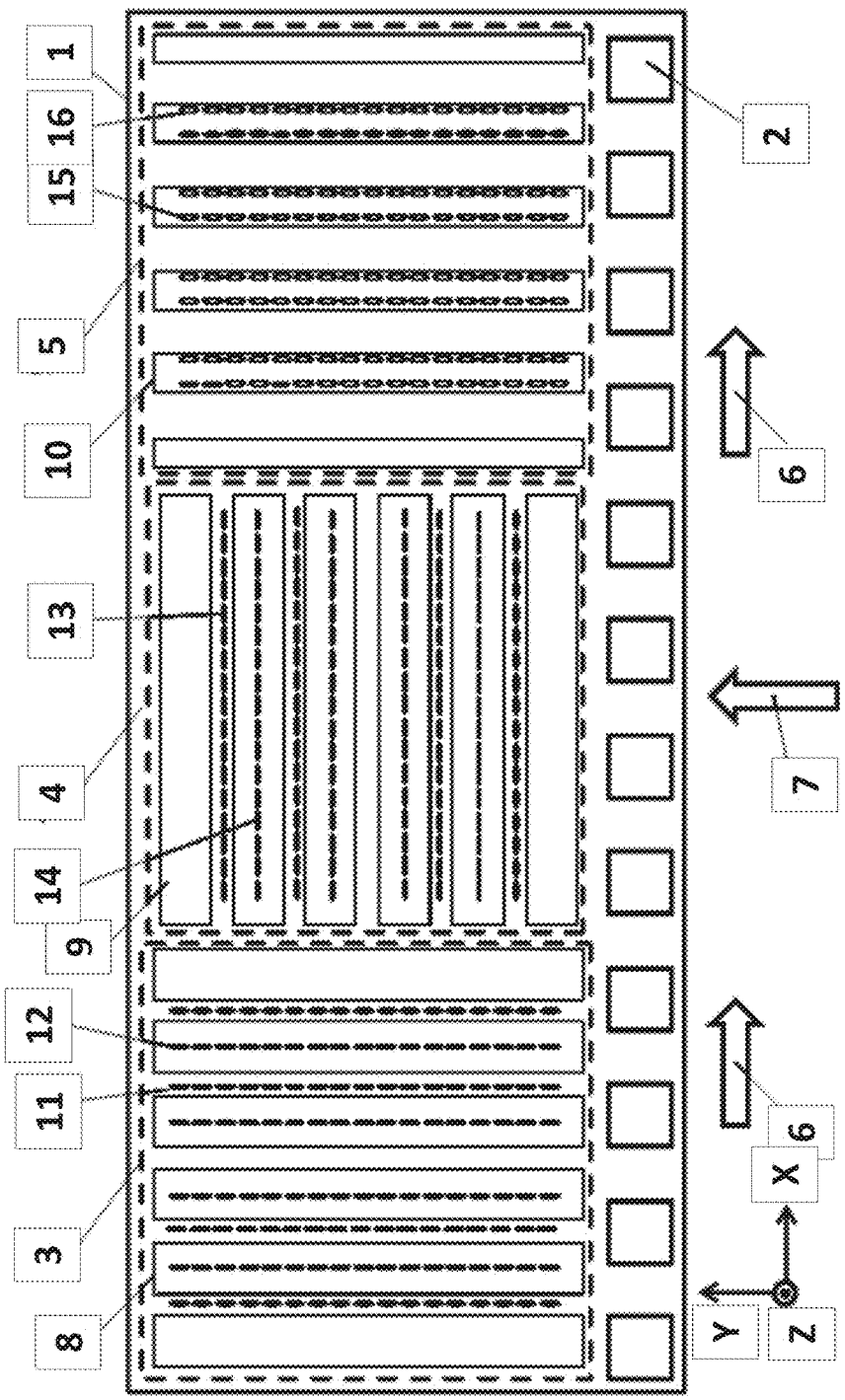
FIG. 1 is a schematic structural diagram of a monolithic three-axis magnetic field sensor in the present invention.

FIG. 1 is a schematic structural diagram of a monolithic three-axis magnetic field sensor in the present invention in an XY plane. The sensor comprises a substrate 1, the substrate 1 is integrated with an X-axis sensor 3, a Y-axis sensor 4, a Z-axis sensor 5 and a plurality of bonding pads 2 for input and output, wherein, the X-axis sensor 3 and the Y-axis sensor 4 have identical structures but different arrangement directions, and they are perpendicular to each other. In FIG. 1, elements in the X-axis sensor 3 are arranged longitudinally, and elements in the Y-axis sensor 4 are arranged transversely; however, elements in the X-axis sensor 3 may also be arranged transversely, and at this point, elements in the Y-axis sensor 4 are arranged longitudinally. The X-axis sensor 3 comprises sensing element series 11, reference element series 12 and an X-magnetic flux guide 8, and the Y-axis sensor 4 comprises sensing element series 13, reference element series 14 and a Y-magnetic flux guide 9, wherein the reference element series 12, 14 are respectively placed beneath the X-magnetic flux guide 8 and the Y-magnetic flux guide 9, the sensing element series 11, 13 are respectively placed at a gap between two adjacent X-magnetic flux guides 8 and a gap between two adjacent Y-magnetic flux guides, and the sensing element series 11, 13 and the reference element series 12, 14 are each formed by electrically connecting one or more identical magnetoresistive sensing elements. The Z-axis sensor comprises a Z-magnetic flux guide 10, and magnetoresistive sensing elements 15, 16, wherein the magnetoresistive sensing elements 15, 16 are electrically connected in columns respectively and arranged at two sides at the bottom of the Z-magnetic flux guide 10. Moreover, magnetoresistive sensing elements forming the reference element series 12, 14 may also be placed above the X-magnetic flux guide 8 and the Y-magnetic flux guide 9 respectively, and at this point, the magnetoresistive sensing elements 15, 16 in the Z-axis sensor are placed at two sides at the top of the Z-magnetic flux guide 10.

All the magnetoresistive sensing elements are GMR spin valves or TMR sensing elements, and may be, but not limited to, square-shaped, rhombic-shaped, or oval-shaped. Magnetization directions 6 of pinned layers of the magnetoresistive sensing elements in the X-axis sensor 3 and the Z-axis sensor 5 are the same, and are both along an X-axis direction, but magnetization directions 6 and 7 of pinned layers of the magnetoresistive sensing elements in the X-axis sensor 3 and the Y-axis sensor 4 are perpendicular to each other. When there is no external magnetic field, the magnetoresistive sensing elements achieve magnetization direction of the magnetic free layer perpendicular to that of the pinned layer by permanent magnet bias, double-exchange interaction, shape anisotropy or any combination thereof. All the magnetic flux guides are each an array of rectangular strips, the length thereof in a direction perpendicular to the magnetization direction of the pinned layer of the magnetoresistive sensing element being greater than the length thereof along the magnetization direction of the pinned layer of the magnetoresistive sensing element, and are made of soft ferromagnetic alloy, wherein the alloy may include, but not limited to, one or more elements including Ni, Fe, Co, Si, B, Ni, Zr and Al. the bonding pads 2 comprise input/output connection bonding pads in the X-axis sensor 3, the Y-axis sensor 4 and the Z-axis sensor 5. The substrate 1 may comprise an ASIC, or may be electrically connected to an additional separate ASIC chip, and the ASIC is not shown in the drawing. In this example, the monolithic three-axis linear magnetic field sensor is packaged by using wire bonding of bonding pads, and may also be packaged by using technologies such as through silicon via, flip-chip, ball grid array (BGA) package, wafer level package (WLP), and chip on board (COB).

Figure 2:
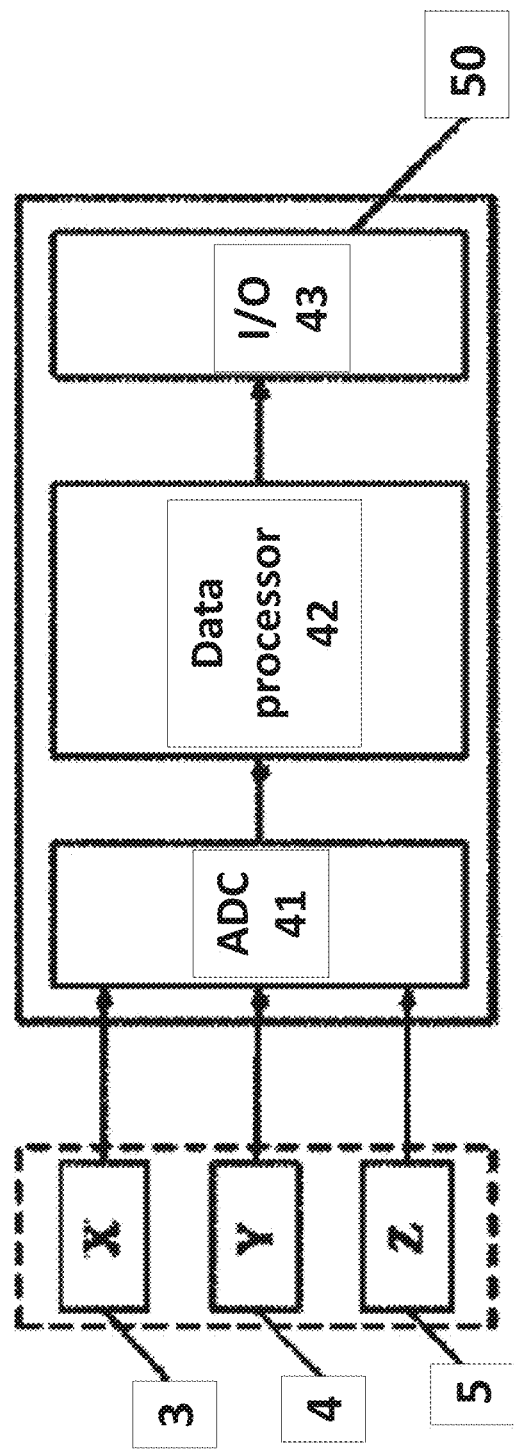
FIG. 2 is a schematic diagram of a digital signal processing circuit of the monolithic three-axis magnetic field sensor in the present invention.

FIG. 2 is a schematic diagram of a digital signal processing circuit of a monolithic three-axis linear magnetic field sensor. Magnetic signals sensed by the X-axis sensor 3, the Y-axis sensor 4 and the Z-axis sensor 5 are analog-to-digital converted by using an ADC 41 in a digital signal processing circuit 50, converted digital signals are transmitted to a data processor 42, and processed signals are output by an I/O, thereby implementing measurement on an external magnetic field. The digital signal processing circuit 50 may be placed on the substrate 1, or placed on another ASIC chip, the ASIC chip being electrically connected to the substrate 1.

Figure 3:
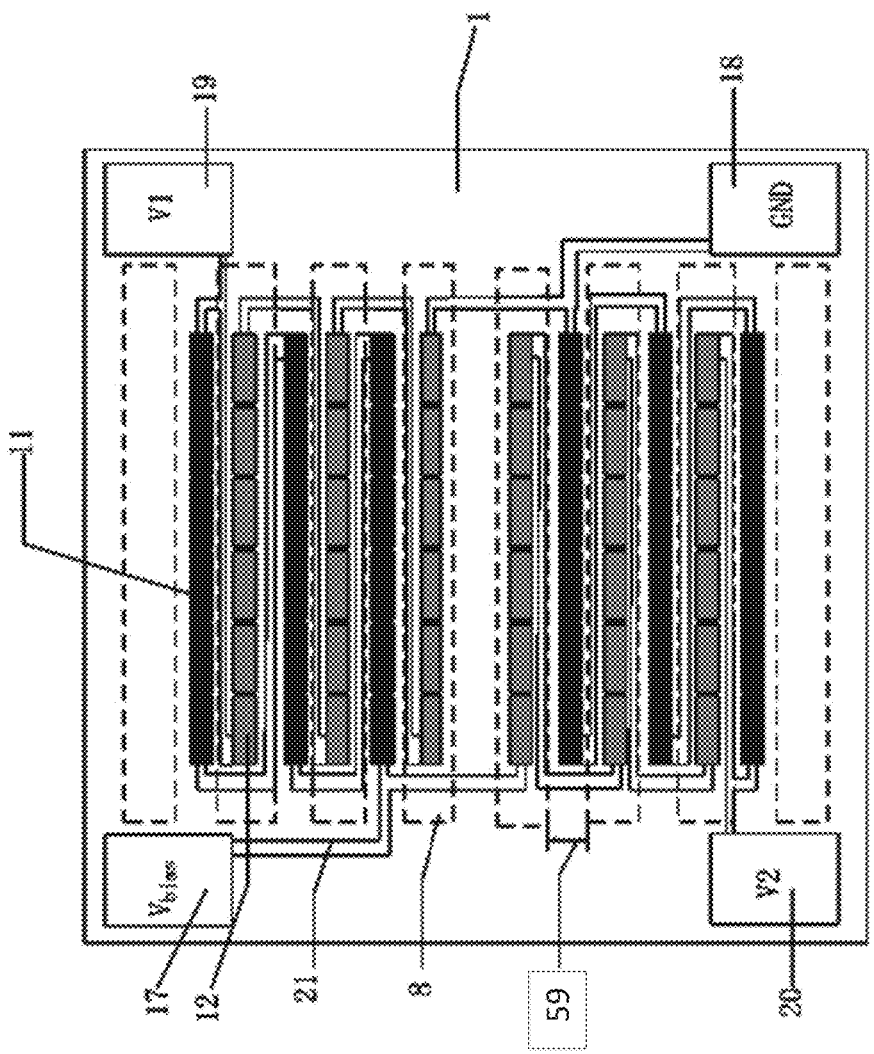
FIG. 3 is a schematic structural diagram of an X-axis sensor and a Y-axis sensor.

FIG. 3 is a schematic structural diagram of the X-axis sensor in FIG. 1. The X-axis sensor is of a reference full-bridge structure, and comprises a reference arm and a sensing arm. The reference arm comprises a plurality of reference element series 12 placed beneath the X-magnetic flux guide, and the sensing arm comprises a plurality of sensing element series 11 placed at gaps 59 of the X-magnetic flux guides. The sensing element series 11 and the reference element series are mutually staggered, and arranged along a long axis direction of the X-magnetic flux guide, wherein each one of the reference element series 12 is adjacent to at least one of the sensing element series 11, and each one of the sensing element series 11 is also adjacent to at least one of the reference element series 12. Each one of the sensing element series 11 is spaced from the adjacent one of the reference element series 12 by an interval L, and the interval L is very small, preferably 20-100 microns. The sensing arm, the reference arm and the bonding pads 17-20 may be connected by an electrical connection conductor 21. The bonding pads 17-20 are each used as an input end Vbias, a ground end GND, and output ends V1, V2, corresponding to the leftmost four bonding p ads in FIG. 1.

Figure 4:
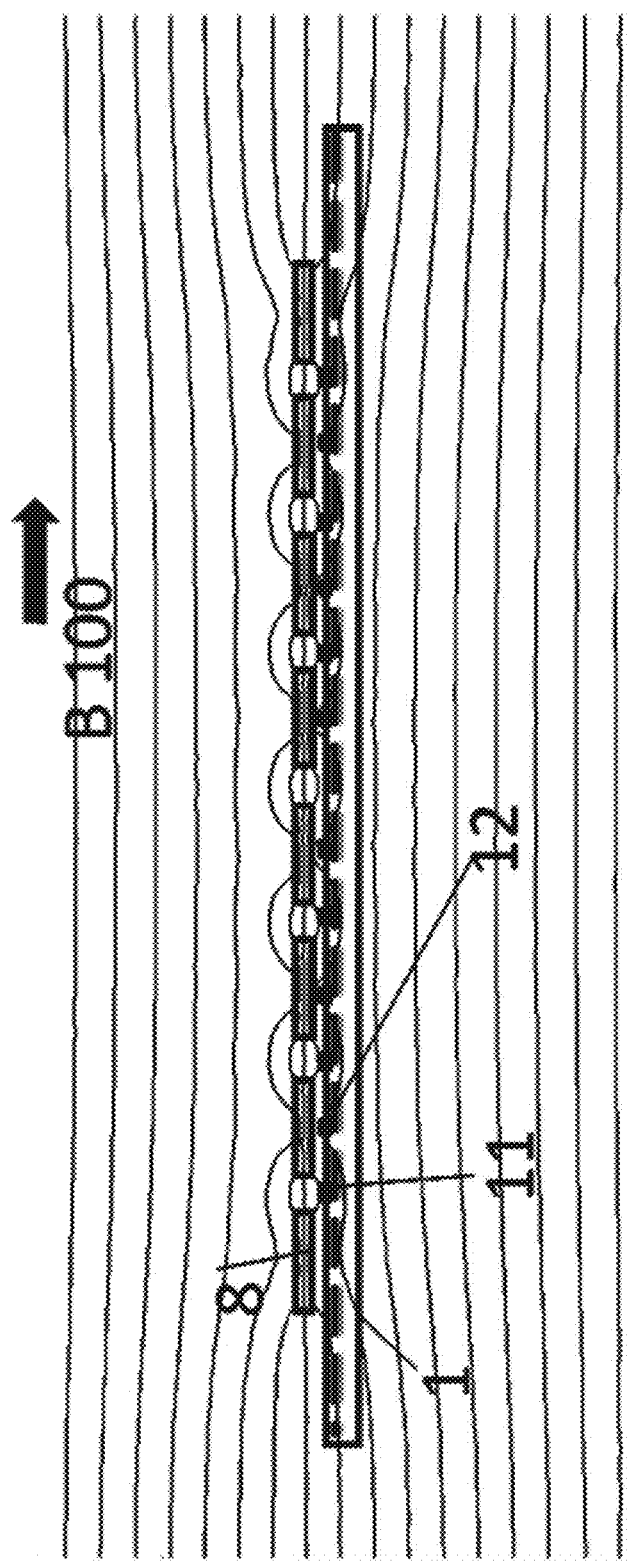
FIG. 4 is a diagram of magnetic field distribution around magnetoresistive elements in the X-axis sensor.

FIG. 4 shows distribution of magnetic fields around the sensing element series 11 and the reference element series 12 in FIG. 3. It can be seen from the drawing that the magnitude of the magnetic field sensed by the sensing element series 11 at the gap of the X-magnetic flux guide 8 is increased, and the magnitude of the magnetic field sensed by the reference element series 12 placed beneath the X-magnetic flux guide 8 is reduced, and it is thus clear that the X-magnetic flux guide 8 can play a role of attenuating magnetic fields.

Figure 5:
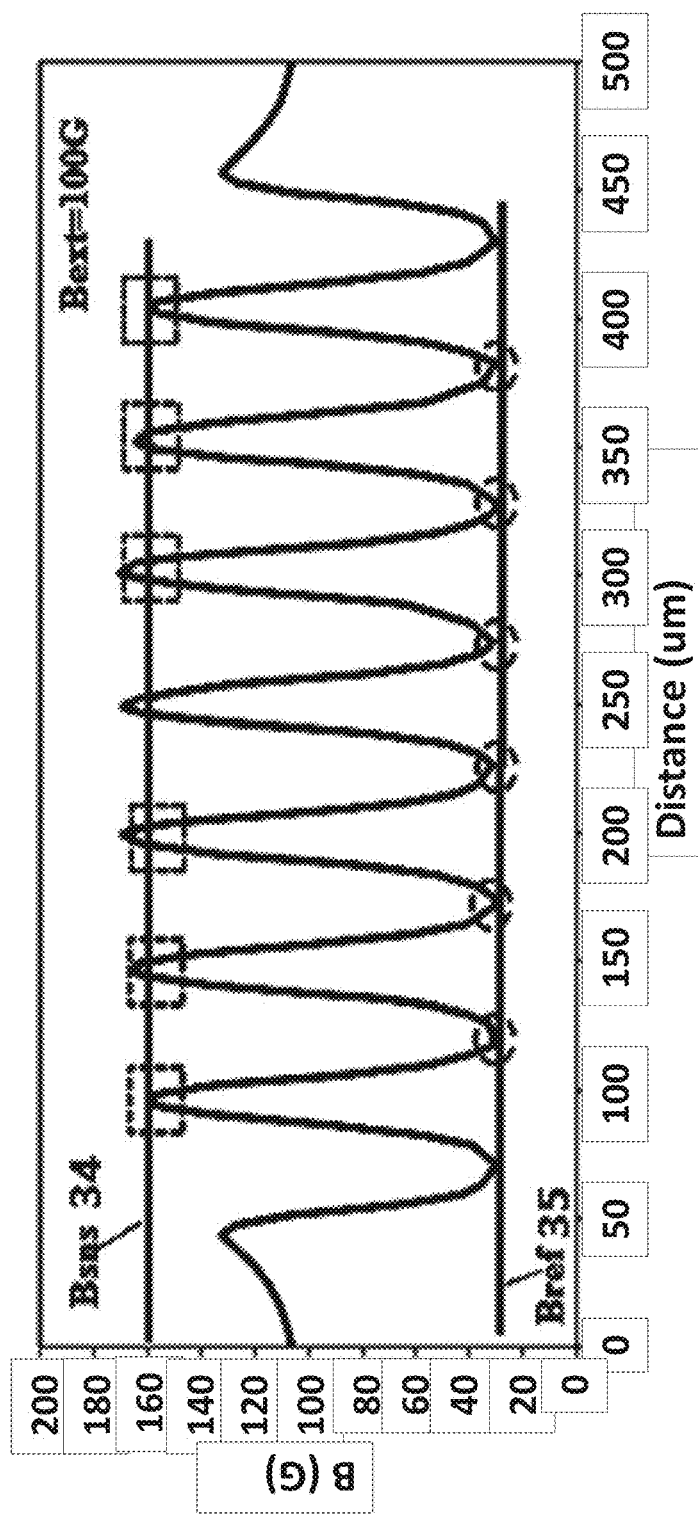
FIG. 5 is a relation curve of the position of an MTJ element in the X-axis sensor vs. the intensity of a magnetic field sensed.

FIG. 5 is a relation curve of positions of the sensing element series 11 and the reference element series 12 in FIG. 3 and intensities of magnetic fields sensed, wherein, $B_{sns}$34 is the intensity of a magnetic field sensed by the sensing element series 11, $B_{ref}$35 is the intensity of a magnetic field sensed by the reference element series 12, and the intensity of an external magnetic field is $B_{ext}$=100G. It can be obtained from the drawing that: $B_{sns}$=160G, $B_{ref}$=25G. Magnitudes of a corresponding gain coefficient $A_{sns}$ and a corresponding attenuation coefficient $A_{ref}$ may be obtained according to the following formulas (1) and (2).

$$B_{sns}=A_{sns}*B_{ext} \quad (1)$$

$$B_{ref}=A_{ref}*B_{ext} \quad (2)$$

$B_{ext}$=100G, $B_{sns}$=160G, and $B_{ref}$=25G are substituted into the above formulas to obtain:

1<Asns=1.6<100, 0<Aref=0.25<1. A greater ratio of $A_{sns}/A_{ref}$ (indicates a higher sensitivity of the sensor. Generally, it is ideal that $A_{sns}/A_{ref}$>5, and at this point, the sensor has a high sensitivity. In this design, Asns/Aref=1.6/0.25=6.4>5, and it is thus clear that the X-axis sensor of this application has a high sensitivity.

Figure 6:
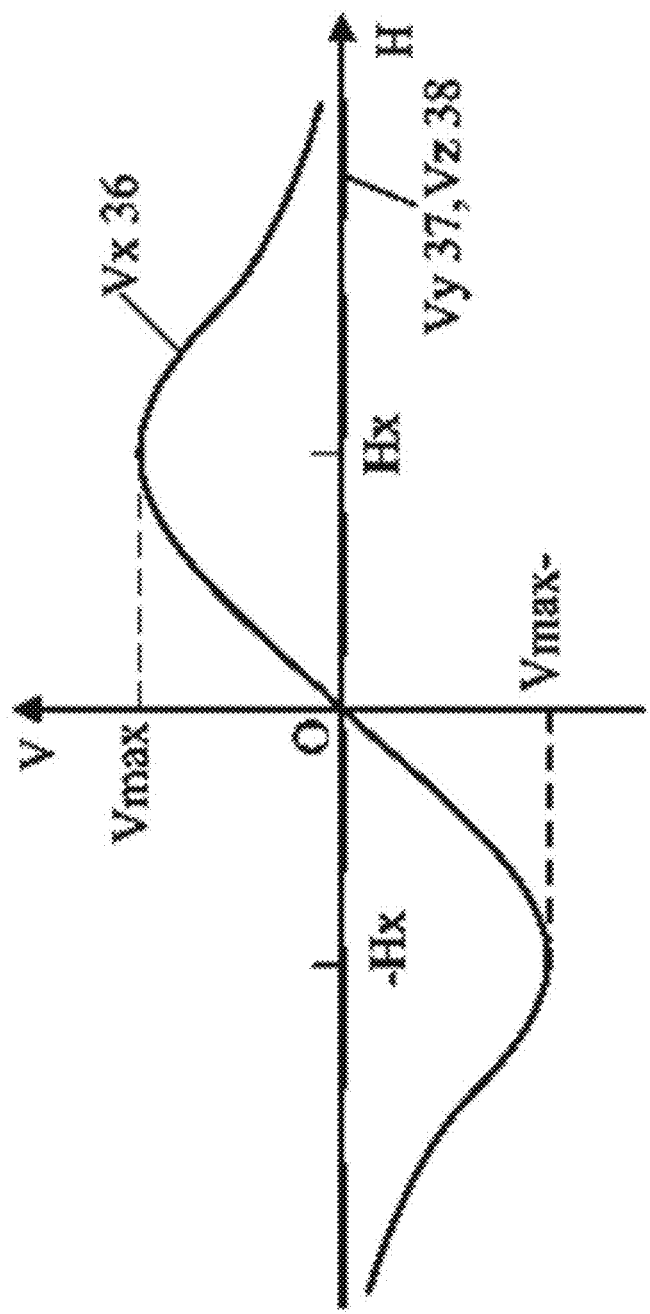
FIG. 6 is a response curve of the X-axis sensor.

FIG. 6 is a relation curve of an output voltage of the X-axis sensor in FIG. 3 vs. the external magnetic field. It can be seen from the drawing that the X-axis sensor can only sense a magnetic field component in an X-axis direction, the output voltage Vx36 does not respond to magnetic field components in a Y-axis direction and a Z-axis direction; voltages Vy37 and Vz38 are both zero, and Vx36 is symmetric about the origin 0.

Figure 7:
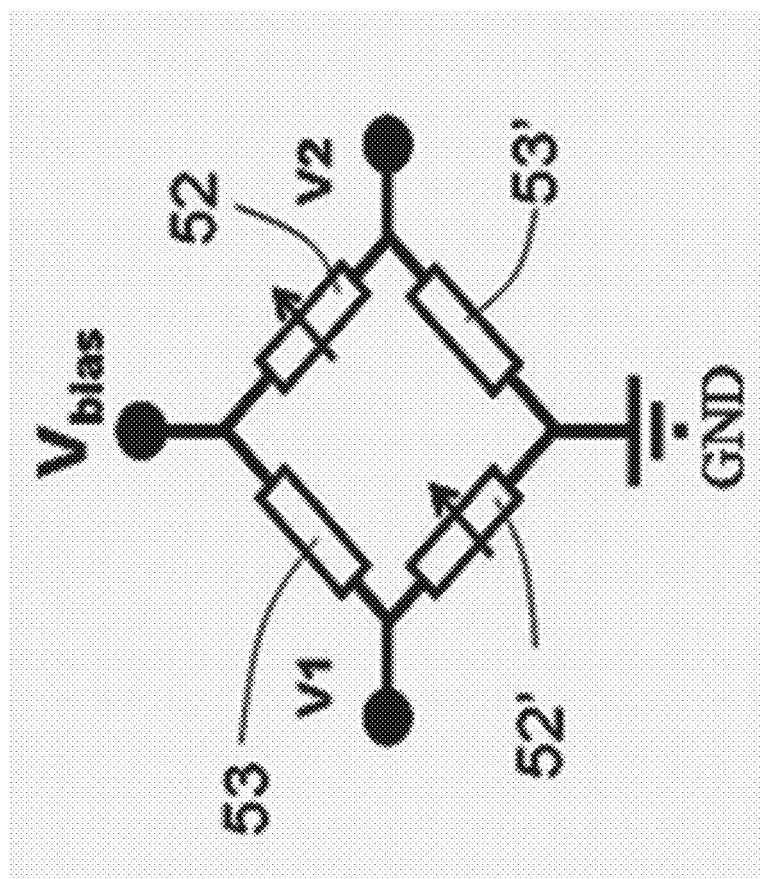
FIG. 7 is a schematic circuit diagram of the X-axis sensor.

FIG. 7 is a schematic circuit diagram of the X-axis sensor in FIG. 3. In the drawing two sensing arms 52, 52' and two reference arms 53, 53' are connected at an interval to construct a full-bridge, and an output voltage of the full-bridge is $$V = V1 - V2 = \frac{R_{sns}}{R_{sns}+R_{ref}}V_{bias} - \frac{R_{ref}}{R_{sns}+R_{ref}}V_{bias} = \quad (3)$$

$$\frac{(A_{sns}-A_{ref})\left(\frac{\Delta R}{\Delta B}\right)B}{2R_L + (A_{sns}+A_{ref})\left(\frac{\Delta R}{\Delta B}\right)B}V_{bias}$$

Then, the sensitivity of the X-axis sensor may be expressed as:

$$\frac{V}{V_{bias}} = \frac{(A_{sns}-A_{ref})\left(\frac{\Delta R}{\Delta B}\right)B}{2R_L + (A_{sns}-A_{ref})\left(\frac{\Delta R}{\Delta B}\right)B} \quad (4)$$

For a very small external magnetic field, that is, the magnetic field intensity B is very small, the above formula (4) may be approximated to:

$$\frac{V}{V_{bias}} \approx \frac{(A_{sns}-A_{ref})}{2R_L}\left(\frac{\Delta R}{\Delta B}\right)B \quad (5)$$

The Y-axis sensor 4 is of a structure identical to that of the X-axis sensor 3, and therefore, a working principle, surrounding magnetic field distribution, and a response curve thereof are all identical to those of the X-axis sensor 3, which are not repeated herein.

Figure 8:
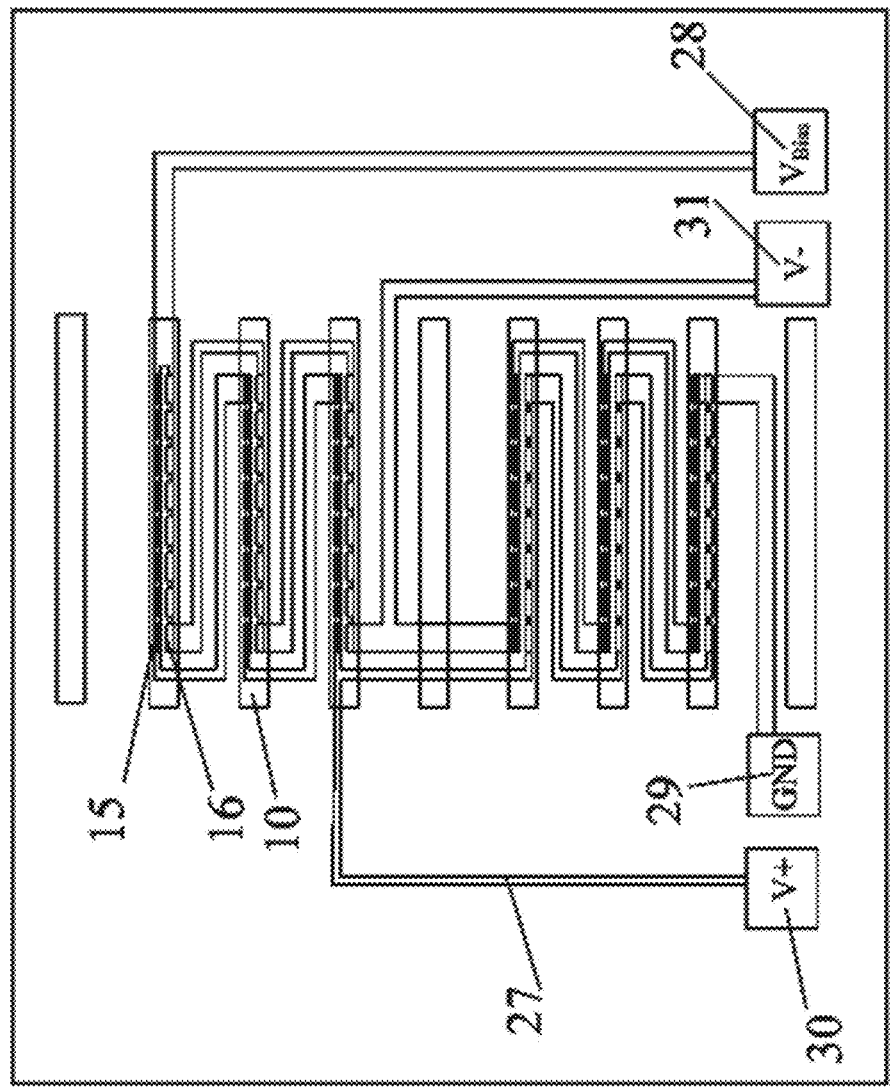
FIG. 8 is a schematic structural diagram of a Z-axis sensor.

FIG. 8 is a schematic structural diagram of a Z-axis sensor. The Z-axis sensor is of a push-pull full-bridge structure. The Z-axis sensor comprises a plurality of magnetoresistive sensing elements 15 and 16, a plurality of Z-magnetic flux guides 10, an electrical connection conductor 27, and bonding pads 28-31, wherein the bonding pads 28-30 are each used as a power supply end $V_{Bias}$, a ground end GND, and voltage output ends V+, V−, corresponding to the rightmost four bonding pads in the bonding pads 2 in FIG. 1. All the magnetoresistive sensing elements 15 are electrically connected to each other to form a push arm of the full-bridge, and all the magnetoresistive sensing elements 16 are electrically connected to each other to form a pull arm of the full-bridge. The push arm is arranged to be spaced from the pull arm, and the push arm, the pull arm and the bonding pads 28-31 are connected through the electrical connection conductor 27 to form the push-pull full-bridge. The magnetoresistive sensing elements 15, 16 are arranged along the length direction of the Z-magnetic flux guides 10. In FIG. 8, the magnetoresistive sensing elements 15, 16 are arranged at two sides at the bottom of the Z-magnetic flux guide 10 in rows, and are covered by the Z-magnetic flux guide 10. Except for the three Z-magnetic flux guides 10 at the upper and lower ends and in the middle, a row of push arm magnetoresistive sensing elements 15 and a row of pull arm magnetoresistive sensing elements 16 are arranged at two sides at the bottom of each Z-magnetic flux guide 10, and if necessary, the magnetoresistive sensing elements 15, 16 may also be arranged beneath the three Z-magnetic flux guides 10.

Figure 9:
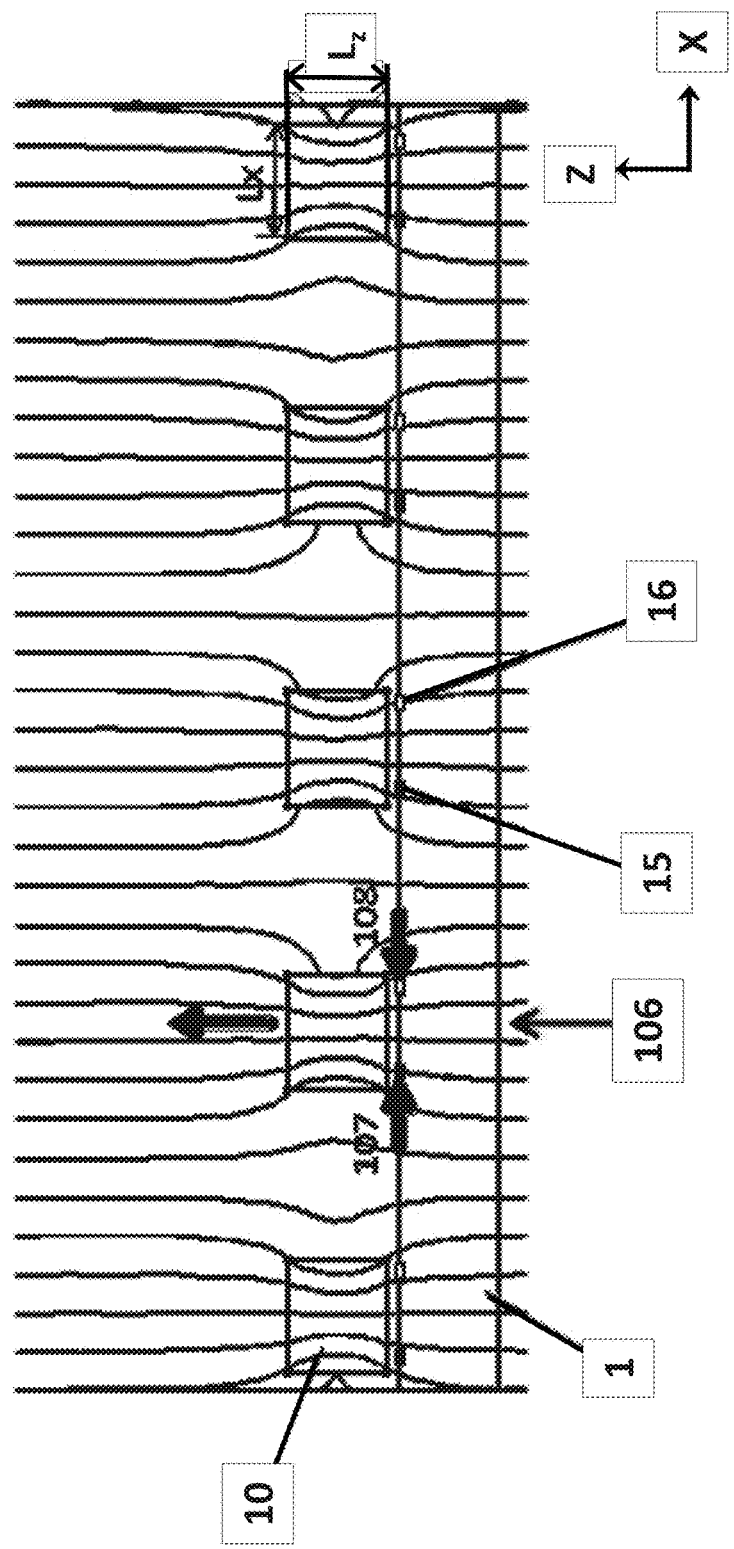
FIG. 9 is a diagram of magnetic field distribution around magnetic flux guides of a Z-axis sensor in a Z-direction magnetic field.

FIG. 9 is a diagram of magnetic field distribution of the Z-axis sensor in an external magnetic field 106 in the Z-axis direction. It can be seen from the distribution of magnetic force lines in the drawing that the external magnetic field is distorted near the Z-magnetic flux guide 10, thereby generating the magnetic field component in the X-axis direction, and the magnetoresistive sensing elements 15 and 16 beneath the Z-magnetic flux guide 10 can just detect this component; however, directions of the magnetic field components detected by them are opposite to each other, and are 107 and 108 respectively. The magnitude of the applied external magnetic field can be known through the detected X-axis magnetic field component.

Figure 10:
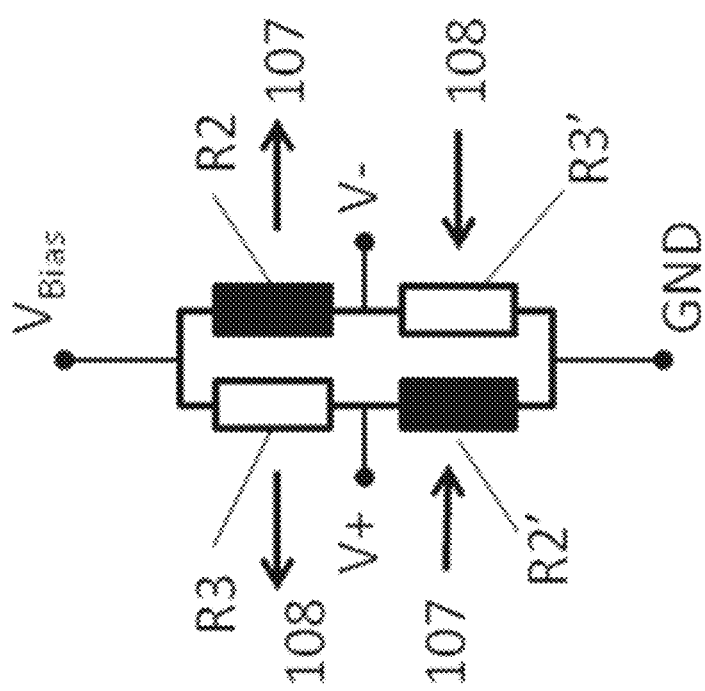
FIG. 10 is a schematic circuit diagram of a Z-axis sensor.

FIG. 10 is a schematic circuit diagram of the Z-axis sensor. Several magnetoresistive sensing elements 15 are electrically connected to form equivalent magnetoresistors R2 and R2', several magnetoresistive sensing elements 16 are electrically connected to form two equivalent magnetoresistors R3 and R3', and the four magnetoresistors are connected to construct a full-bridge. When an external magnetic field in the Z-axis direction is applied, changing situations of resistances of the magnetoresistors R2, R2' and R3, R3' may be opposite to each other, thereby constructing a push-pull output. Generally, R2'=R2, and R3'=R3. It can be obtained from FIG. 10 that an output voltage of the circuit is:

$$V_{out} = V_+ - V_- = \frac{R2 - R3}{R2 + R3} V_{Bias} \quad (9)$$

The sensitivity thereof is $$\frac{V_{out}}{V_{Bias}} = \frac{R2 - R3}{R2 + R3} \quad (10)$$

Figure 11:
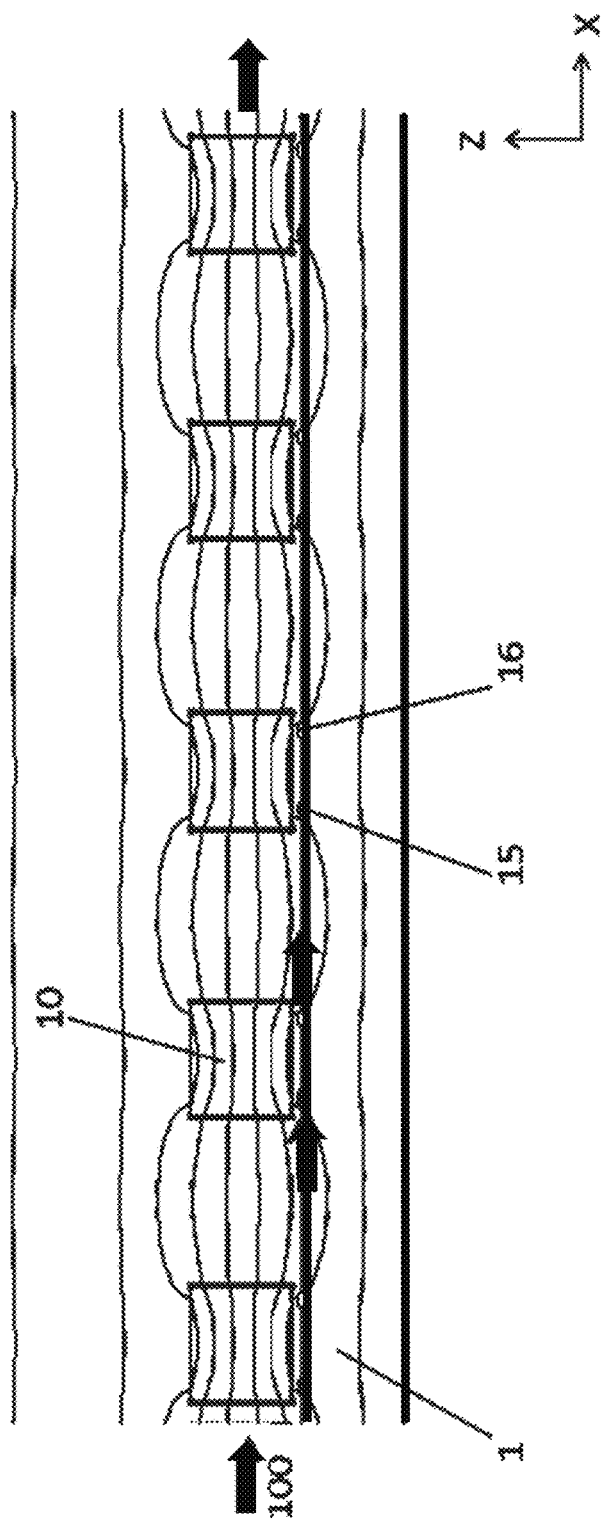
FIG. 11 is a distribution of magnetic field diagram around magnetic flux guides of a Z-axis sensor in an X-direction magnetic field.

FIG. 11 is a diagram of magnetic field distribution of the Z-axis sensor in an external magnetic field 100 in the X-axis direction. It can be seen from the drawing that magnetic fields detected by the magnetoresistive sensing elements 15 and 16 are the same, this may result in that changing situations of resistances of the magnetoresistors R2, R2' and R3, R3' are the same, such that no push-pull output is formed, and therefore, the sensor will not respond.

Figure 12:
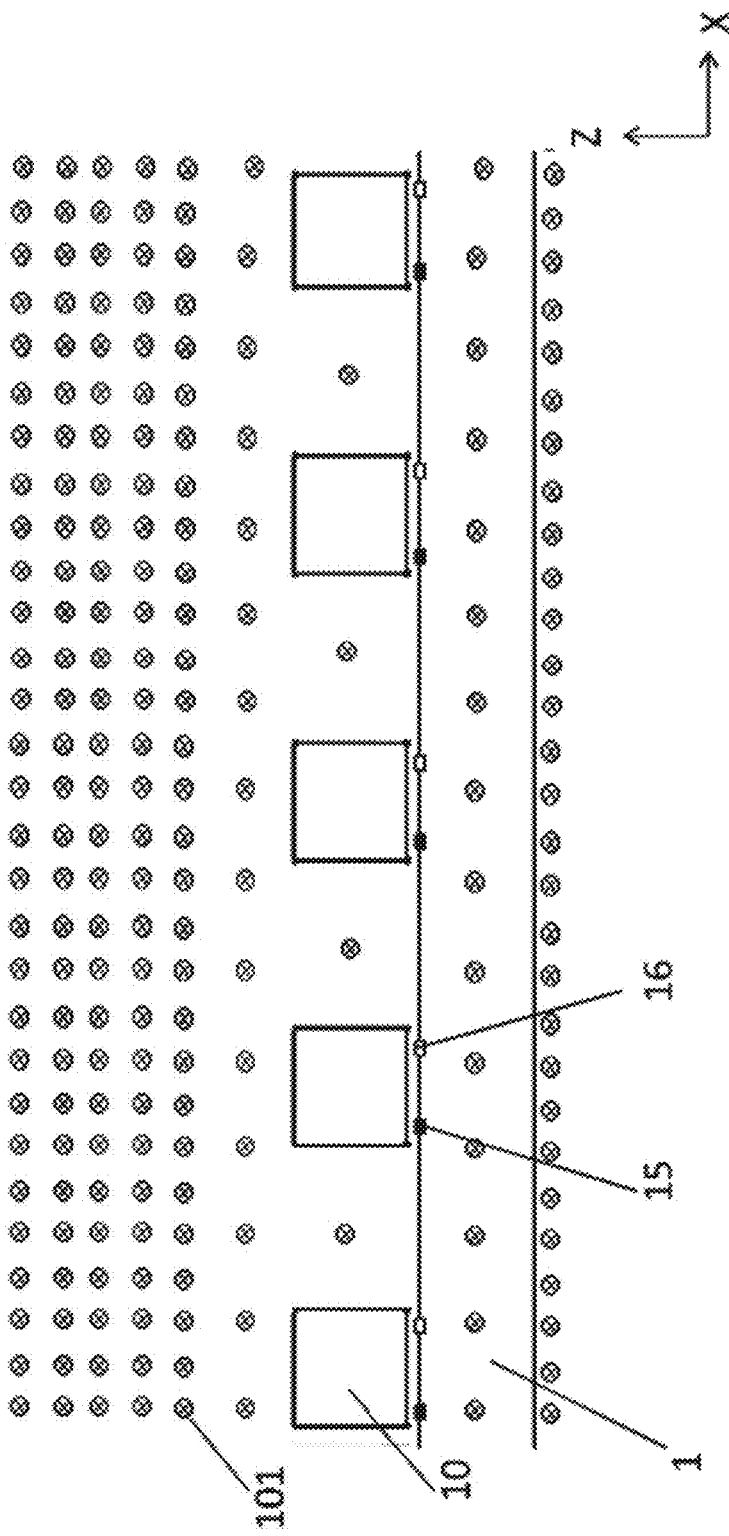
FIG. 12 is a diagram of magnetic field distribution around magnetic flux guides of a Z-axis sensor in a Y-direction magnetic field.

FIG. 12 is a diagram of magnetic field distribution of the Z-axis sensor in an external magnetic field 101 in the Y-axis direction. It can be seen from the drawing that the Z-magnetic flux guide 10 completely shields the external magnetic field in the Y-axis direction, and the magnetoresistive sensing elements 15, 16 are insensitive to the magnetic field in the Y-axis direction; therefore, the magnetoresistive sensing elements 15, 16 do not detect any magnetic field component, and the Z-axis sensor does not respond either.

Figure 13:
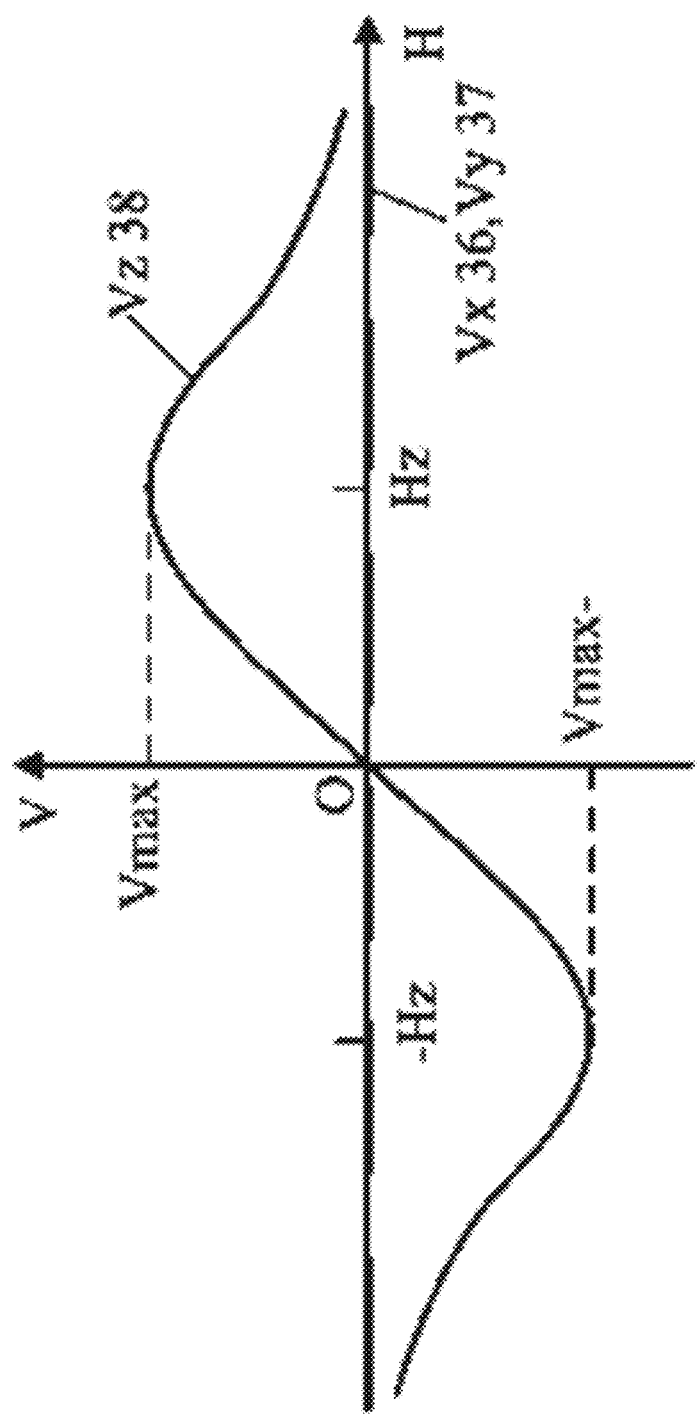
FIG. 13 is a response curve of a Z-axis sensor.

FIG. 13 is a relation curve of an output voltage of the Z-axis sensor vs. an external magnetic field. It can be seen from the drawing that the Z-axis sensor can only sense the magnetic component in the Z-axis direction, the output voltage Vz38 does not respond to magnetic field components in the X-axis and Y-axis directions, voltages Vx36 and Vy37 are both 0, and Vz38 is symmetric about the origin 0.

The above discusses the situations when the bridges in the X-axis sensor, the Y-axis sensor and the Z-axis sensor are full-bridges, and since working principles of a half-bridge and a quasi-bridge are the same, they are not repeated herein. The conclusions obtained above are also applicable to monolithic three-axis linear magnetic field sensors in a half-bridge structure and a quasi-bridge structure.

Example 2

Figure 14:
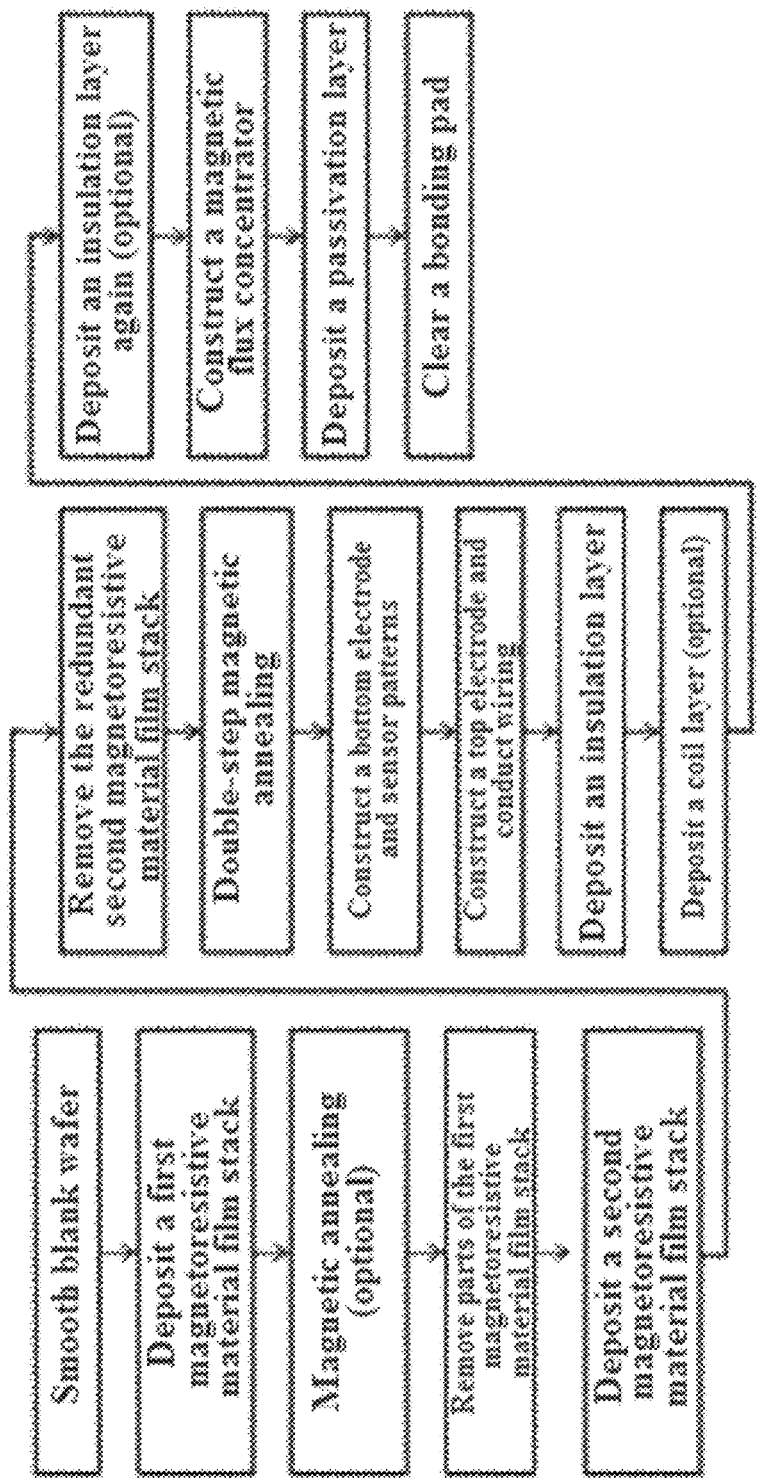
FIG. 14 is a schematic flow chart of a method for manufacturing a monolithic three-axis magnetic field sensor in the present invention.
Figure 15:
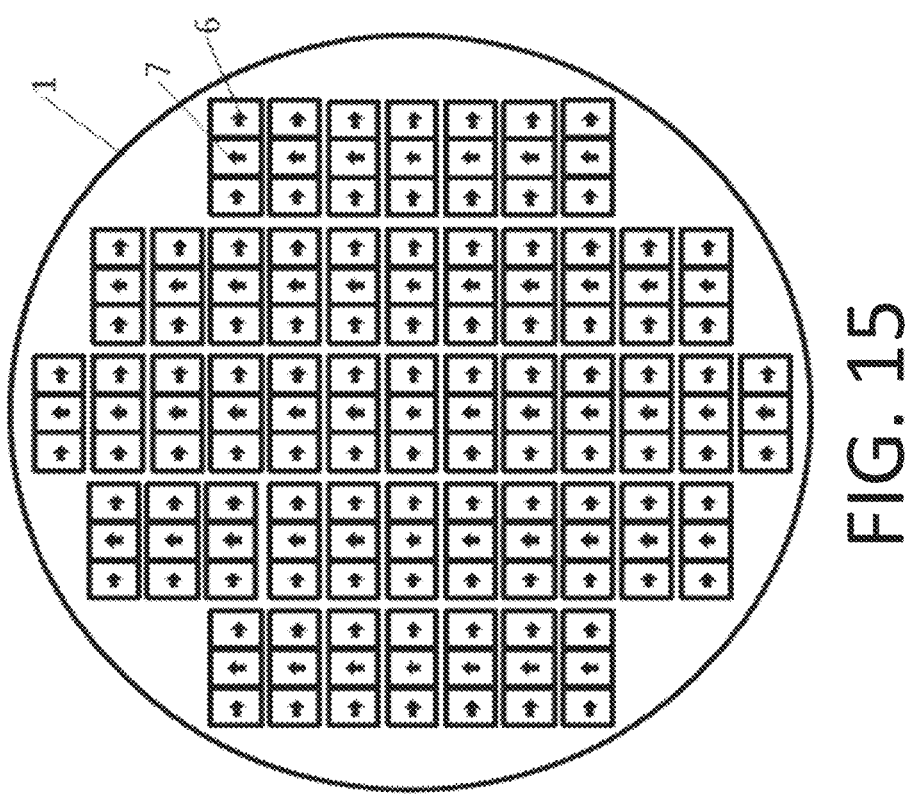
FIG. 15 is a schematic diagram of magnetization directions of pinned layers on an X-axis sensor, a Y-axis sensor and a Z-axis sensor after double-deposition of a wafer.

FIG. 14 is a process flow for manufacturing a monolithic three-axis magnetic field sensor in the present invention, and the method for manufacturing the sensor comprises the following steps:

(1) depositing a first magnetoresistive material film stack on a wafer, and setting a magnetization direction of a pinned layer on the first magnetoresistive material film stack by using a related process, preferably setting the magnetization direction of the pinned layer by high-temperature annealing in a magnetic field; and the first magnetoresistive material film stack being used to construct an X-axis sensor and a Z-axis sensor;

(2) selecting a region on the wafer, and removing the first magnetoresistive material film stack in the selected region through photolithography, ion etching or other technologies and cleaning up, to deposit a second magnetoresistive material film stack; and the second magnetoresistive material film stack being used to construct a Y-axis sensor;

(3) removing the second magnetoresistive material film stack deposited on the region of the first magnetoresistive material film stack, and conducting double steps of annealing to set magnetization directions of a pinned layer of the second magnetoresistive material film stack to be perpendicular to the magnetization directions of the pinned layer of the first magnetoresistive material film stack;

after double deposition, magnetization directions of the pinned layers of the sensors on the wafer being as shown in FIG. 15, wherein the magnetization directions of the pinned layers of the X-axis sensor and the Z-axis sensor are 6, and the direction of the pinned layer of the Y-axis sensor is 7;

(4) conducting masking, and removing parts of the second magnetoresistive material film stack overlapping with the first magnetoresistive material film stack, and preferably, removing the overlapped parts of the second magnetoresistive material film stack by using a lift-off process;

(5) constructing a bottom electrode, and constructing patterns of magnetoresistive sensing elements in the X-axis sensor, Y-axis sensor and Z-axis sensor in the same photolithography and subtractive patterning step, the subtractive patterning comprising methods such as wet etching, ion etching and reactive ion etching;

(6) depositing a top conducting layer, forming a top electrode using photolithography and subtractive patterning, and wiring between elements; the top conducting layer being electrically connected to a top layer of the magnetoresistive sensing element, and the subtractive patterning being wet etching or ion etching;

(7) depositing an insulation layer, and electroplating an X-magnetic flux guide, a Y-magnetic flux guide and a Z-magnetic flux guide above the insulation layer at the same time by using the same soft ferromagnetic material; if necessary, depositing a conducting layer on the insulation layer to construct an electromagnetic coil layer, depositing another insulation layer on the coil layer, and then electroplating an X-magnetic flux guide, a Y-magnetic flux guide and a Z-magnetic flux guide;

(8) plating a passivation layer above all the X-magnetic flux guide, Y-magnetic flux guide and Z-magnetic flux guide, etching the passivation layer and opening vias at positions corresponding to the top electrode and the bottom electrode, and forming a bonding pad connected to the external. When there is a coil layer, vias may be opened in the passivation layer and the coil layer at positions corresponding to the top electrode and the bottom electrode, to form a bonding pad connected to a sensor chip. Preferably, a conducting metal may be further sputtered or electroplated at a top end of the bonding pad.

Figure 16:
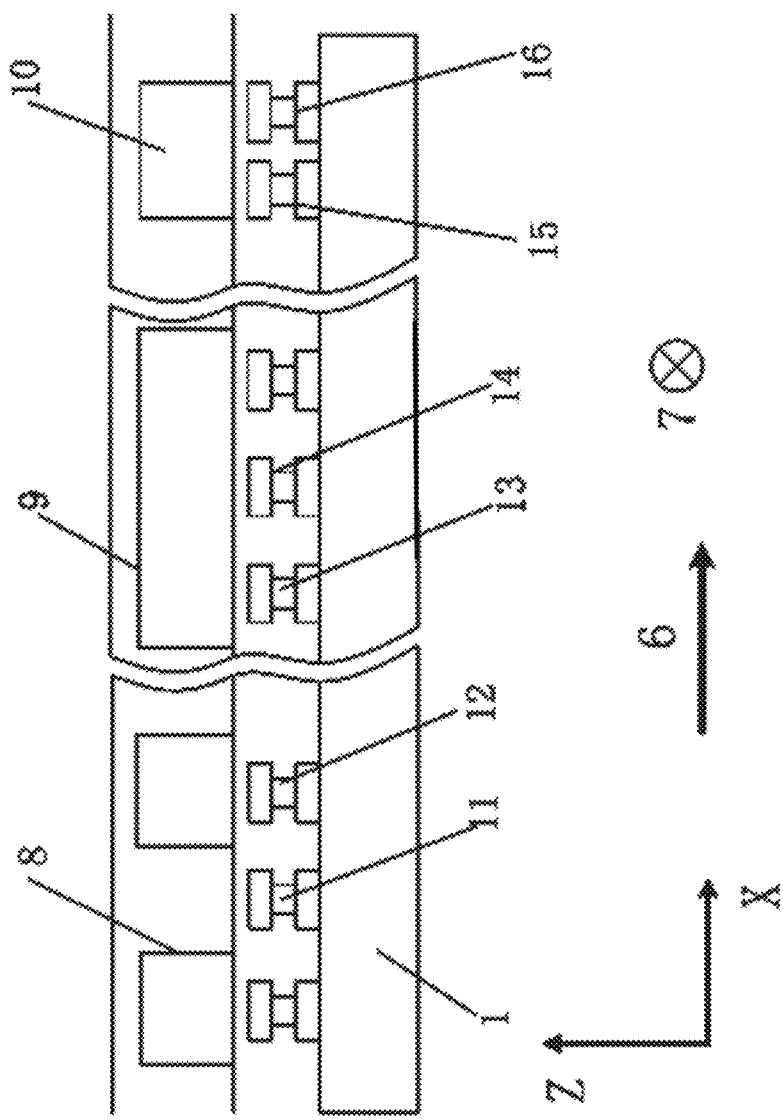
FIG. 16 is a schematic sectional diagram of a manufactured monolithic three-axis magnetic field sensor.
Figure 17:
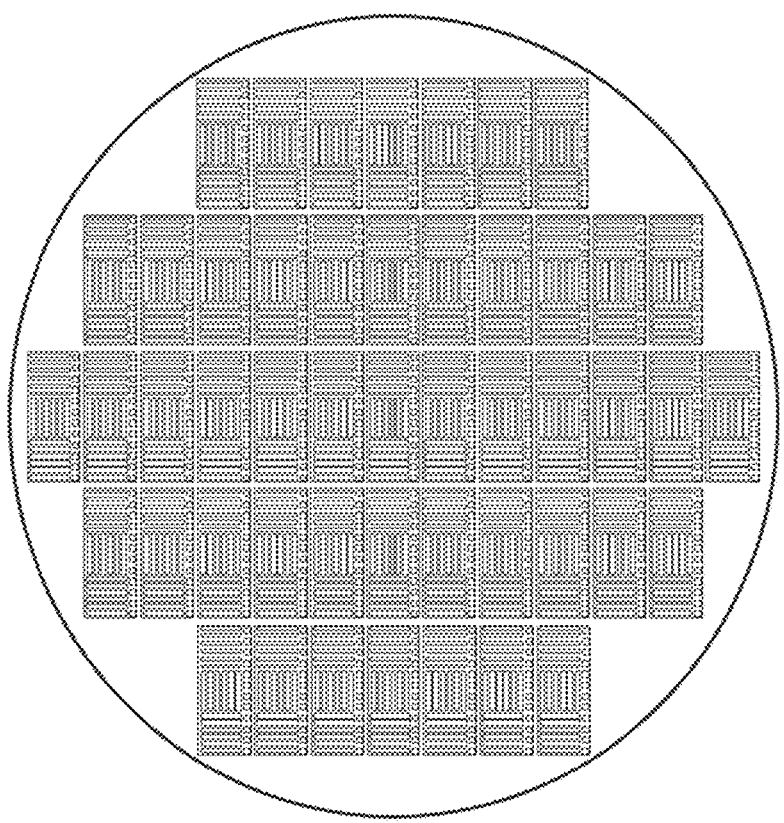
FIG. 17 is a schematic diagram of structural arrangement of three-axis magnetic field sensors on a wafer before a wafer sawing process is accomplished.

After the above steps are implemented, a schematic sectional diagram of a single monolithic three-axis sensor is shown in FIG. 16, and a schematic diagram of structural arrangement of all the three-axis sensors on a wafer is shown in FIG. 17.

The wafer in the above steps may be a silicon wafer doped with an integrated circuit, a silicon wafer subjected to chemico-mechanical polishing, or a blank silicon wafer comprising a passivated smooth surface, and the wafer may further comprise coils. Moreover, antiferromagnetic materials on the pinned layers in the first magnetoresistive material film stack and the second magnetoresistive material film stack are different, the structure of the first magnetoresistive material film stack is PtMn/SAF/tunnel barrier/free layer/IrMn, the structure of the second magnetoresistive material film stack is IrMn/SAF/tunnel barrier/free layer/PtMn, and the two stack structures are also interchangeable. The blocking temperature TB1 of PtMn is higher than the blocking temperature TB2 of IrMn, and in this way, the films used for constructing the X-axis sensor and the Y-axis sensor may be annealed in the same step, and magnetization directions of a bias layer and the pinned layer may also be crossed at the same time. The double-step annealing conducted in the step (2) refers to first conducting annealing in a high-temperature magnetic field at the temperature higher than TB1, at this point, an applied magnetic field being along the X-axis direction, and then conducting annealing in a low-temperature magnetic field at the temperature between TB1 and TB2, at this point, a direction of a magnetic field applied to the wafer being perpendicular to the direction of the high-temperature magnetic field.

The above descriptions are merely preferred examples of the present invention, and are not intended to limit the present invention. For those skilled in the art, the present invention may have various modifications and changes. Any modification, equivalent replacement, improvement and the like without departing from the spirit and principle of the present invention should fall within the protection scope of the present invention.

The invention claimed is:

1. A monolithic three-axis magnetic field sensor comprising:

a substrate in an XY plane, the substrate having an X-axis sensor, a Y-axis sensor and a Z-axis sensor integrated thereon for detecting magnetic field components in an X-axis direction, a Y-axis direction and a Z-axis direction, respectively;

the X-axis sensor and the Y-axis sensor each comprising a reference bridge and at least two magnetic flux guides, a reference arm and a sensing arm of the reference bridge each comprising one or more identical magnetoresistive sensing elements electrically connected to one another, the magnetoresistive sensing elements on the reference arm being placed above or beneath the magnetic flux guides, and being arranged along length directions of the magnetic flux guides to form reference element series, the magnetoresistive sensing elements on the sensing arm being placed at gaps between the adjacent two of the magnetic flux guides, and being arranged along the length directions of the magnetic flux guides to form sensing element series; the reference element series and the sensing element series being mutually staggered, each one of the reference element series being adjacent to at least one of the sensing element series, and each one of the sensing element series being adjacent to at least one of the reference element series; arrangement directions of elements in the Y-axis sensor are mutually perpendicular to those of corresponding elements in the X-axis sensor;

all gain coefficients of magnetic fields at gaps between the respective adjacent two of the magnetic flux guides in the X-axis sensor and the Y-axis sensor are $1<A_{sns}<100$, and all attenuation coefficients of magnetic fields above or beneath the magnetic flux guides of the X-axis sensor and the Y-axis sensor are $0<A_{ref}<1$;

the Z-axis sensor comprising a push-pull bridge and at least one magnetic flux guide, a push arm and a pull arm of the push-pull bridge being staggered and each comprising the one or more identical magnetoresistive sensing elements electrically connected to one another, the magnetoresistive sensing elements on the push arm and the pull arm being arranged along a length direction of the magnetic flux guide in the Z-axis sensor, and respectively placed at two sides of the bottom or the top of the magnetic flux guide in the Z-axis sensor; and pinned layers of the magnetoresistive sensing elements of the X-axis sensor and the Y-axis sensor are made of different materials, and magnetization directions of the pinned layers are perpendicular to each other; magnetization directions of pinned layers of the Z-axis sensor and the X-axis sensor are the same; when there is no external magnetic field, magnetization directions of magnetic free layers of all the magnetoresistive sensing elements are perpendicular to the magnetization directions of the pinned layers;

wherein, the X-axis, the Y-axis and the Z-axis are pairwise orthogonal to one another.

2. The monolithic three-axis magnetic field sensor according to claim 1, wherein the magnetoresistive sensing element is a Giant Magnetoresistive (GMR) spin valve element or a Tunneling Magnetoresistive (TMR) sensing element.

3. The monolithic three-axis magnetic field sensor according to claim 1, wherein the magnetic flux guide is an array of rectangular strips, the length thereof in a direction perpendicular to the magnetization direction of the pinned layer of the magnetoresistive sensing element being greater than the length thereof along the magnetization direction of the pinned layer of the magnetoresistive sensing element, and is made of soft ferromagnetic alloy.

4. The monolithic three-axis magnetic field sensor according to claim 1, wherein the numbers of the magnetoresistive sensing elements on the respective sensing arms and reference arms of the X-axis sensor and the Y-axis sensor are the same; and the numbers of the magnetoresistive sensing elements on the push arm and the pull arm of the Z-axis sensor are the same.

5. The monolithic three-axis magnetic field sensor according to claim 1, wherein the length of the magnetoresistive sensing element in a direction perpendicular to the magnetization direction of the pinned layer is greater than the length thereof along the magnetization direction of the pinned layer.

6. The monolithic three-axis magnetic field sensor according to claim 1, wherein a gap S between the adjacent two of the magnetic flux guides of the Z-axis sensor is not less than the minimum one of three-dimensional sizes of the magnetic flux guide of the Z-axis sensor.

7. The monolithic three-axis magnetic field sensor according to claim 1, wherein when there is no external magnetic field, the magnetoresistive sensing elements achieve magnetization direction of the magnetic free layer perpendicular to that of the pinned layer by permanent magnet bias, double-exchange interaction, shape anisotropy or any combination thereof.

8. The monolithic three-axis magnetic field sensor according to claim 1, wherein the reference bridge and the push-pull bridge are both of a half-bridge, full-bridge or quasi-bridge structure.

9. The monolithic three-axis magnetic field sensor according to claim 1, wherein the substrate is integrated with an Application-Specific Integrated Circuit (ASIC) chip thereon, or the substrate is electrically connected to a separate ASIC chip.

10. The monolithic three-axis magnetic field sensor according to claim 1, wherein the monolithic three-axis magnetic field sensor further comprises at least 3 bonding pads, or the X-axis sensor, the Y-axis sensor and the Z-axis sensor each have at least 3 through silicon vias.

11. A method for manufacturing a monolithic three-axis linear magnetic field sensor, the manufacturing method comprising:

depositing a first magnetoresistive material film stack on a semiconductor wafer, and then setting a magnetization direction of a pinned layer of the first magnetoresistive material film stack, or depositing a first magnetoresistive material film stack on a semiconductor wafer, and then setting a magnetization direction of a pinned layer of the first magnetoresistive material film stack by annealing, the first magnetoresistive material film stack using an antiferromagnetic layer having a blocking temperature of TB1 as its pinned layer, and the first magnetoresistive material film stack being used to construct an X-axis sensor and a Z-axis sensor;

selecting some regions on the semiconductor wafer, and removing the first magnetoresistive material film stack in the selected regions;

depositing a second magnetoresistive material film stack on the semiconductor wafer, the second magnetoresistive material film stack using an antiferromagnetic layer having a blocking temperature of TB2 as its pinned layer, and the second magnetoresistive material film stack being used to construct a Y-axis sensor, wherein TB1>TB2; conducting first high-temperature annealing in an external magnetic field having a magnetic field direction being parallel to the magnetization directions of the pinned layers of the X-axis sensor and the Z-axis sensor at a temperature higher than TB 1, reducing the temperature to a value between TB 1 and TB2, rotating the external magnetic field so that the direction thereof is identical to the magnetization direction of the pinned layer of the Y-axis sensor, reducing the temperature to room temperature, and reducing the external magnetic field to a zero magnetic field;

masking the first magnetoresistive material film stack and the second magnetoresistive material film stack, and removing parts of the second magnetoresistive material film stack overlapping with the first magnetoresistive material film stack;

constructing a bottom electrode, and constructing magnetoresistive sensing elements in the X-axis sensor, the Y-axis sensor and the Z-axis sensor in the same structure forming step, wherein the bottom electrode is constructed before or after the magnetoresistive sensing elements of the X-axis sensor, the Y-axis sensor and the Z-axis sensor are constructed;

depositing an insulation layer I on the magnetoresistive sensing element, and producing a contact hole at a top end of the magnetoresistive sensing element through the insulation layer I; the contact hole being implemented by a self-alignment technology comprising a lift off process, or implemented by opening a hole downward at a top end of the magnetoresistive sensing element through the insulation layer I by use of a photolithographic or etching process;

depositing a top conducting layer electrically connected to a top layer of the magnetoresistive sensing element, forming a top electrode using a patterning process, and wiring between elements;

depositing an insulation layer II, or depositing an insulation layer III, then depositing a conducting layer on the deposited insulation layer III to construct an electromagnetic coil layer, and depositing an insulation layer IV at the top of the electromagnetic coil layer;

synchronously forming a plurality of magnetic flux guides above the insulation layer II or the insulation layer IV by using the same soft ferromagnetic material; and depositing a passivation layer above all the magnetic flux guides, etching the passivation layer, opening vias at positions corresponding to the top electrode and the bottom electrode, and forming a bonding pad connected to a sensor chip, or depositing a passivation layer above all the magnetic flux guides, etching the passivation layer, opening vias at positions corresponding to the top electrode and the bottom electrode, forming a bonding pad connected to a sensor chip, and sputtering or electroplating a conducting metal at a top end of the bonding pad.

12. The manufacturing method according to claim 11, wherein the semiconductor wafer is a silicon wafer doped with an integrated circuit, a silicon wafer subjected to chemico-mechanical polishing, or a blank silicon wafer comprising a passivated smooth surface.

* * * * *